(12) United States Patent
Köseoglu et al.

(10) Patent No.: US 11,104,845 B2
(45) Date of Patent: Aug. 31, 2021

(54) PHOSPHOR ARRANGEMENT AND METHOD

(71) Applicant: Vestel Elektronik Sanayi ve Ticaret A.S., Manisa (TR)

(72) Inventors: Devrim Köseoglu, Manisa (TR); Kadriye Ertekin, Manisa (TR)

(73) Assignee: Vestel Elektronik Sanayi ve Ticaret A.S.

( * ) Notice: Subject to any disclaimer, the term of this patent is extended or adjusted under 35 U.S.C. 154(b) by 347 days.

(21) Appl. No.: 16/324,505

(22) PCT Filed: Sep. 21, 2017

(86) PCT No.: PCT/EP2017/073888
§ 371 (c)(1),
(2) Date: Feb. 8, 2019

(87) PCT Pub. No.: WO2018/055028
PCT Pub. Date: Mar. 29, 2018

(65) Prior Publication Data
US 2019/0203112 A1 Jul. 4, 2019

(30) Foreign Application Priority Data

Sep. 21, 2016 (EP) .................................. 16189940

(51) Int. Cl.
*C09K 11/02* (2006.01)
*H01L 33/50* (2010.01)
*C09K 11/08* (2006.01)

(52) U.S. Cl.
CPC .............. *C09K 11/02* (2013.01); *C09K 11/08* (2013.01); *H01L 33/501* (2013.01); *H01L 33/504* (2013.01); *H01L 2933/0091* (2013.01)

(58) Field of Classification Search
CPC ........ C09K 11/02; C09K 11/025; C09K 11/08
(Continued)

(56) References Cited

U.S. PATENT DOCUMENTS 8,663,500 B2  3/2014  Emoto et al.
8,674,388 B2  3/2014  Shioi et al.
(Continued)

FOREIGN PATENT DOCUMENTS

GB    2 517 883      3/2015
KR    2016 0075495   6/2016
WO    2014/014079    1/2014

OTHER PUBLICATIONS

The International Search Report (ISR) for PCT/EP2017/073888 dated Nov. 24, 2017, pp. 1-4.
(Continued)

*Primary Examiner* — Christopher M Raabe
(74) *Attorney, Agent, or Firm* — McDonnell Boehnen Hulbert & Berghoff LLP

(57) ABSTRACT

The present invention provides a phosphor arrangement (30) for light conversion, in particular for conversion of blue light into white light. The phosphor arrangement (30) comprises a substrate (10) with a mounting surface (11). The phosphor arrangement (30) further comprises a polymer (20) with a phosphor mixture (21), wherein the polymer (20) is arranged on the mounting surface (11), and wherein the phosphor mixture (21) comprises metallic nanoparticles (5), and wherein a content of the metallic nanoparticles (5) is between 1.5 to 3.0 mmol/kg of the polymer (20). The present invention further provides a corresponding method.

13 Claims, 5 Drawing Sheets

(58) Field of Classification Search
USPC .......................................................... 428/328
See application file for complete search history.

(56) References Cited

U.S. PATENT DOCUMENTS

| | | | |
|---|---|---|---|
| 8,686,626 B2 | 4/2014 | Won et al. | |
| 2013/0126785 A1* | 5/2013 | Zhou ...................... | C09K 11/87 |
| | | | 252/301.6 F |
| 2013/0343997 A1* | 12/2013 | Kennedy ............ | A61K 49/0065 |
| | | | 424/9.1 |
| 2015/0155449 A1* | 6/2015 | Kim ...................... | H01L 33/505 |
| | | | 257/13 |
| 2015/0300578 A1* | 10/2015 | Ivan ....................... | H05B 33/14 |
| | | | 362/84 |

OTHER PUBLICATIONS

Written Opinion of the International Searching Authority for PCT/EP2017/073888 dated Nov. 24, 2017, pp. 1-6.

\* cited by examiner

PHOSPHOR ARRANGEMENT AND METHOD

CROSS-REFERENCE TO RELATED APPLICATION

This application is a U.S. national phase of International Application No. PCT/EP2017/073888, filed Sep. 21, 2017, which claims priority to European Patent Application No. 16189940.6, filed Sep. 21, 2016, both of which are incorporated by reference herein in their entirety.

TECHNICAL FIELD

The invention relates to a phosphor arrangement for light conversion and a method for manufacturing the same.

BACKGROUND

Although applicable to any phosphor arrangement to convert light the present invention will mainly be described with respect to yellow phosphor, green phosphor and red phosphor in conjunction with so called metallic nanoparticles.

The conversion of blue LED (Light Emitting Diode) light into white light is typically accomplished by utilizing phosphors.

These inorganic solid state phosphors which typically comprise rare-earth (lanthanide) or transition metal ions as emissive elements are typically settled in crystal hosts such as oxides of silicates, aluminates, borates, and phosphates, sulfides/oxysulfides, nitrides/oxynitrides and fluorides/oxyfluorides. The wavelength of the emitted light depends upon the energy levels of these settled ions. These settled ions also encountered as activators are Ce, Dy, Er, Eu, Gd, Ho, Nd, Pr, Sm, Tb, Tm, and Yb. The above mentioned hosts and activators are nowadays used for manufacturing phosphors applied in LED industry.

Such phosphors are described in U.S. Pat. No. 8,663,500 B2, U.S. Pat. No. 8,674,388 B2 and U.S. Pat. No. 8,686,626 B2, for example.

Further, tunable quantum dot emissions along with phosphors are nowadays used.

However, it is known that quantum dots with cadmium (Cd) and other restricted heavy metals in the quantum dots, respectively are toxic and difficult to manage.

Therefore, developing new phosphor arrangements with better excitation and emission characteristics used in combination with blue LEDs is still challenging.

Accordingly, there is a need for an improved phosphor arrangement for light conversion which is in particular environmentally friendly. Thus, there is a need for an improved phosphor arrangement with better excitation and emission characteristics used in combination with blue LED.

SUMMARY

The present invention provides phosphor arrangement with the features of claim 1 and a method for manufacturing a phosphor arrangement with the features of claim 11.

The phosphor arrangement for light conversion, in particular for conversion of blue light into white light, comprises a substrate with a mounting surface. The phosphor arrangement further comprises a polymer with a phosphor mixture, wherein the polymer is arranged on the mounting surface. Finally, the phosphor mixture of the phosphor arrangement comprises metallic nanoparticles, wherein a content of the metallic nanoparticles is between 1.5 to 3.0 mmol/kg of the polymer.

The method for manufacturing a phosphor arrangement comprises the step of arranging a polymer with a phosphor mixture on a mounting surface of a substrate. The method further comprises the step of adding metallic nanoparticles in the phosphor mixture, wherein a content of the metallic nanoparticles is between 1.5 to 3.0 mmol/kg of the polymer. Finally, the method further comprises the step of encapsulating the mounting surface of the substrate by cross-linking of the polymer with the phosphor mixture and the metallic nanoparticles.

The substrate can be transparent or translucent. The substrate can be e.g. substantially even or can be roughened on an opposite site with respect to the polymer to scatter light. The polymer with the phosphor mixture can be mounted or arranged on the mounting surface by hydrolysis or suspension, for example. The here described polymer can be thinned by an appropriate solvent prior to coating. Alternatively, the polymer can be as a foil.

The polymer can be a cross-linked polymeric matrix, wherein the here described metallic nanoparticles along with the phosphor mixture are homogeneously distributed within the polymeric matrix. The metallic nanoparticles are in particular conductive such that their optical properties arise from Surface Plasmon Resonance (SPR). Therefore, the here described phosphor arrangement provides better optical properties as well as higher emission efficiencies.

The here described phosphor arrangement can be used e.g. in a wide variety of fields including production of the White Light Emitting Diodes (WLEDs), lighting systems, display systems, automotive applications, medical devices which can be autoclaved, portable systems, imaging, fiber optics, sensor design, passive light sources and/or photo luminescent material coatings.

The present invention uses the finding that optical properties of in particular conductive gold (Au), silver (Ag) and copper (Cu) nanoparticles arise from the Surface Plasmon Resonance (SPR) of these metals. This phenomenon, in which the free electrons oscillate collectively on the nanoscale metal surface when excited with particular wavelengths of light, causes wavelength dependent absorption and scattering of light, in particular blue light. The size, shape, and composition of the colloidal metallic nanoparticles determines in particular absorption and emission characteristics of the SPR. Controlled synthesis of the metallic nanoparticles provides a way to tune the optical properties of the phosphors of the phosphor mixture.

Further embodiments of the present invention are subject of the further subclaims and of the following description, referring to the drawings.

In one embodiment, the phosphor mixture comprises yellow phosphor, green phosphor and red phosphor. Generic formula of the here described phosphors can be e.g. ((YGd)3Al5O12:Ce) for the yellow phosphor, (Lu3Al5O12:Ce) for the green phosphor and (CaAlSiN3:Eu) for the red phosphor.

In detail:

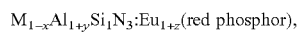

$$M_{1-x}Al_{1+y}Si_1N_3:Eu_{1+z} \text{(red phosphor)},$$

wherein M is selected from the alkaline earth metals with Ca, Ba or their mixture, and wherein $0.0001 \leq x \leq 0.0022$; $0.001 \leq y \leq 0.055$ and $0.005 \leq z \leq 0.25$.

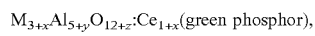

$$M_{3+x}Al_{5+y}O_{12+z}:Ce_{1+x} \text{(green phosphor)},$$

wherein M is selected from the Lanthanides with Yb, Lu or their mixture, and wherein $0.0005 \leq x \leq 0.0022$; $0.0001 \leq y \leq 0.005$ and $0.0015 \leq z \leq 0.25$.

And finally

(yellow phosphor), wherein M is selected from the transition metals with Sc, Y or their mixture, and wherein $0.0001 \leq x \leq 0.0022$ and $0.0001 \leq y \leq 0.0005$.

By using the phosphor mixture based on these formulas a Correlated Color Temperature (CCT) range between 3000-4000 K can be efficiently obtained in conjunction with the metallic nanoparticles. Simultaneously warm white light with an effective bandwidth between 500 nanometer and 700 nanometer can be efficiently achieved in conjunction with the metallic nanoparticles.

In one embodiment, the yellow phosphor, the green phosphor and the red phosphor are configured to be mixed in a ratio of 1:3:1 by weight or 1:5:1 by weight. By mixing the yellow phosphor, the green phosphor and the red phosphor with the here described ratios the above mentioned Correlated Color Temperature (CCT) between 3000-4000 K and warm white light with the bandwidth between 500 nanometer and 700 nanometer can be efficiently achieved. Preferably a weight fraction of the red phosphor and the green phosphor is 2.8-4.5% and 14.0-21.0%, respectively. The yellow phosphor may be in the range of 1.0-4.0% by weight.

In one embodiment, the metallic nanoparticles comprise silver nanoparticles, gold nanoparticles, silver coated zinc oxide nanohexagons or gold coated zinc oxide nanohexagons. It is clear that also a mixture of the here described metallic nanoparticles can be added to the polymer or rather the phosphor mixture. The here described metallic nanoparticles can be abbreviated as follows: silver nanoparticles (AgNPs), or gold nanoparticles (AuNPs), or silver coated zinc oxide nanohexagons (Ag@ZnO nanohexagons) or gold coated zinc oxide nanohexagons (Au@ZnO nanohexagons). These metallic nanoparticles efficiently support the light conversion in the desired range of in particular warm white light. In other words the Surface Plasmon Resonance phenomenon in conjunction with the phosphor mixture can be easily realized. Further, the here described metallic nanoparticles are in particular non-toxic dopants and therefore environmentally friendly. Thus, the toxic effect of quantum dots with e.g. cadmium (Cd) can be avoided.

In one embodiment, a diameter of the metallic nanoparticles is preferably in a range of 20 nanometer and 100 nanometer. This range is in particular preferable for the here described Correlated Color Temperature CCT between 3000-4000 K and warm white light with the bandwidth between 500 nanometer and 700 nanometer.

In one embodiment, the polymer comprises a two component polymer or a two component silicone. By using in particular the two component polymer or the two component silicone the mounting surface can be easily encapsulated as the two component polymer or the two component silicone can be easily mounted or arranged on the mounting surface prior cross-linking.

In one embodiment, the two component silicone comprises phenyl silicone with a refractive index between 1.52 and 1.56. Phenyl silicone in particular maintains their optical and mechanical properties with respect to aging. Therefore, the efficiency of the phosphor arrangement can be increased by using such high refractive index encapsulant mounted or arranged on the mounting surface of the substrate. This material is in particular stable for wavelength in the range of 400 nanometer to 700 nanometer. Alternatively, the two component silicone can comprise methyl silicone or a mixture of phenyl and methyl silicone. The here described silicone can be thinned by an appropriate solvent prior to coating.

In one embodiment, the substrate comprises polystyrene, poly(methyl methacrylate) or polycarbonate. These transparent or translucent substrates are in particular stable against yellowing under long term operation. Alternatively, a curable silicone can be used as the encapsulant. The term curable silicone means two component and cross-linked silicone, respectively which can be treated with heat between 150-180° C.

In one embodiment, a thickness of the polymer is between 15 micrometer to 20 micrometer. Under the term "thickness" a vertical extent of the polymer with the phosphor mixture and the metallic nanoparticles in a direction oblique, in particular perpendicular, shall be understood. This thickness range can be selected to obtain the here described Correlated Color Temperature CCT between 3000-4000 and warm white light with the bandwidth between 500 nanometer and 700 nanometer.

In one embodiment, the metallic nanoparticles are homogeneously distributed within the phosphor mixture and the yellow phosphor, the green phosphor and the red phosphor are homogeneously distributed within the phosphor mixture. By the homogeneous distribution the conversion can be efficiently conducted.

The features of the phosphor arrangement are also disclosed for the method and vice versa.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments, which are specified in the schematic figures of the drawings, in which.

DETAILED DESCRIPTION OF THE DRAWINGS

Figure 1:
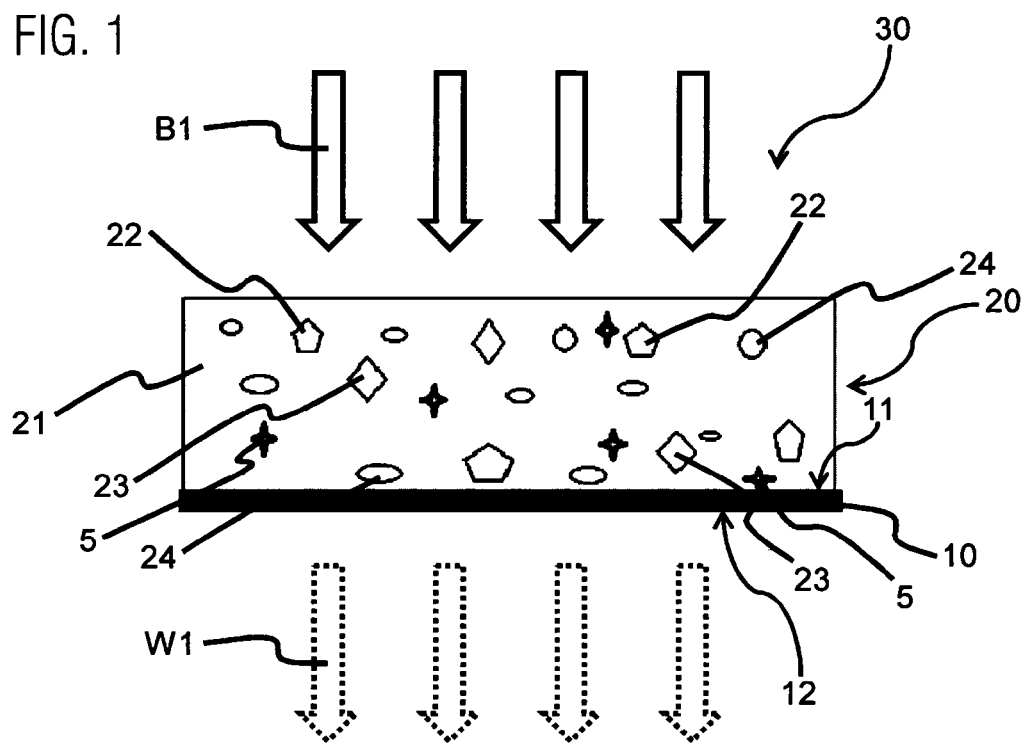
FIG. 1 shows a schematic cross-sectional view of an embodiment of a phosphor arrangement according to the present patent application.

FIG. 1 shows a schematic cross-sectional view of an embodiment of the phosphor arrangement 30 for light conversion, in particular for conversion of blue light B1 into warm white light W1. The phosphor arrangement 30 comprises a substrate 10 with a mounting surface 11. Further, the phosphor arrangement 30 comprises a polymer 20 with a phosphor mixture 21. The polymer 20 is mounted, arranged or located on the mounting surface 11. The phosphor mixture 21 comprises metallic nanoparticles 5, wherein the phosphor mixture 21 can be configured to comprise yellow phosphor 22, green phosphor 23 and red phosphor 24. A content of the metallic nanoparticles 5 is between 1.5 to 3.0 mmol/kg of the polymer 20.

The substrate 10 can be transparent or translucent. In one embodiment, the substrate 10 comprises polystyrene, poly (methyl methacrylate) or polycarbonate. These transparent or translucent substrates are in particular stable against yellowing under long term operation. The substrate 10 can be e.g. substantially even or can be roughened on an opposite site 12 with respect to the polymer 20 to scatter light. The polymer 20 with the phosphor mixture 21 and the metallic nanoparticles 5 can be mounted or arranged on the mounting surface 11 by hydrolysis or suspension, for example.

The metallic nanoparticles 5 are preferably homogeneously distributed within the phosphor mixture 21 and the yellow phosphor 22, the green phosphor 23 and the red phosphor 24 are preferably homogeneously distributed within the phosphor mixture 21. By the homogeneous distribution the conversion of the blue light B1 into warm white light W1 can be efficiently conducted.

By the here described phosphor mixture 21 a Correlated Color Temperature CCT range between 3000-4000 K can be efficiently obtained, wherein the yellow phosphor 22, the green phosphor 23 and the red phosphor 24 are in conjunction with the metallic nanoparticles 5. Simultaneously, warm white light W1 with an effective bandwidth between 500 nanometer and 700 nanometer can be achieved. Additionally, very high Colour Rendering Indexes (CRI>95) can be achieved.

The metallic nanoparticles 5 comprise silver nanoparticles, gold nanoparticles, silver coated zinc oxide nanohexagons or gold coated zinc oxide nanohexagons. In other words the Surface Plasmon Resonance phenomenon of the metallic nanoparticles 5 in conjunction with the phosphor mixture 21 can be easily realized by the mentioned conductive metals. Further, the here described metallic nanoparticles are in particular non-toxic dopants and therefore environmentally friendly. Thus, the toxic effect of quantum dots with e.g. cadmium (Cd) can be avoided.

The yellow phosphor 22, the green phosphor 23 and the red phosphor 24 are configured to be mixed in a ratio of 1:3:1 by weight or 1:5:1 by weight. By mixing the yellow phosphor 22, the green phosphor 23 and red phosphor 24 with the here described ratios the above mentioned Correlated Color Temperature CCT between 3000-4000 K and warm white light with the bandwidth between 500 nanometer and 700 nanometer can be efficiently achieved.

The here in the following described excitation and emission spectra are detected by using poly (methyl methacrylate) or polycarbonate substrates. A thickness or vertical extend of the polymer 20 is between 15 micrometer to 20 micrometer. As material for the polymer 20 a silicone or a two component silicone can be chosen.

Figure 2:
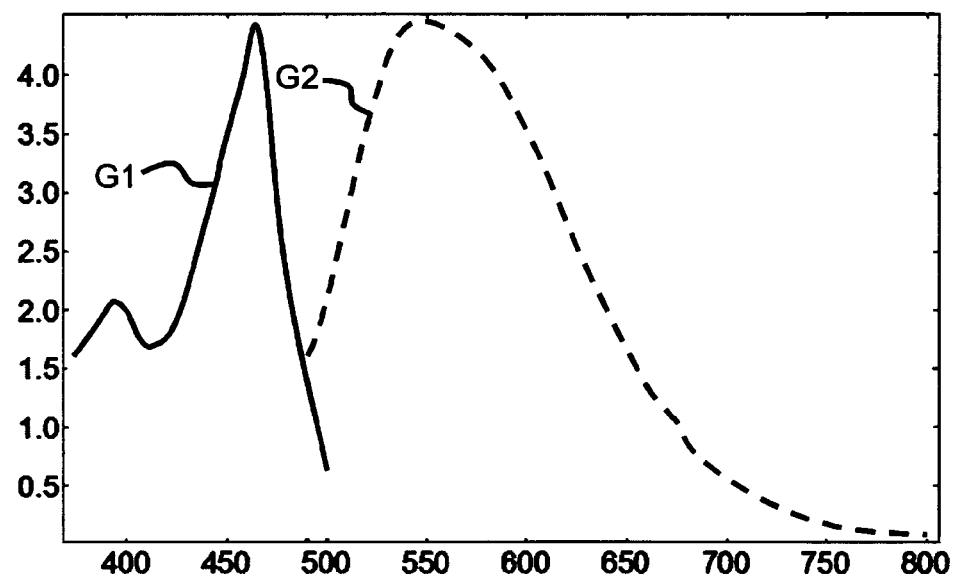
FIG. 2 shows a graphic representation of excitation and emission spectra of an embodiment of a phosphor arrangement with yellow phosphor according to the present patent application.

FIG. 2 shows a graphic representation of excitation spectrum G1 and emission spectrum G2 of an embodiment of the phosphor arrangement 30 with the yellow phosphor 22. The X-axis represents the wavelength in nanometer and Y-axis represents corresponding counts/$10^5$.

The emission spectrum G1 was measured after excitation at 466 nanometer and the excitation spectrum G2 was measured at 582 nanometer. The yellow phosphor 22 exhibited an effective bandwidth FWHM (full width at half maximum) around 150 nanometer which is between 510-660 nanometer in terms of the wavelength range. The yellow phosphor 22 exhibited a Stoke's shift of 152 nanometer.

Figure 3:
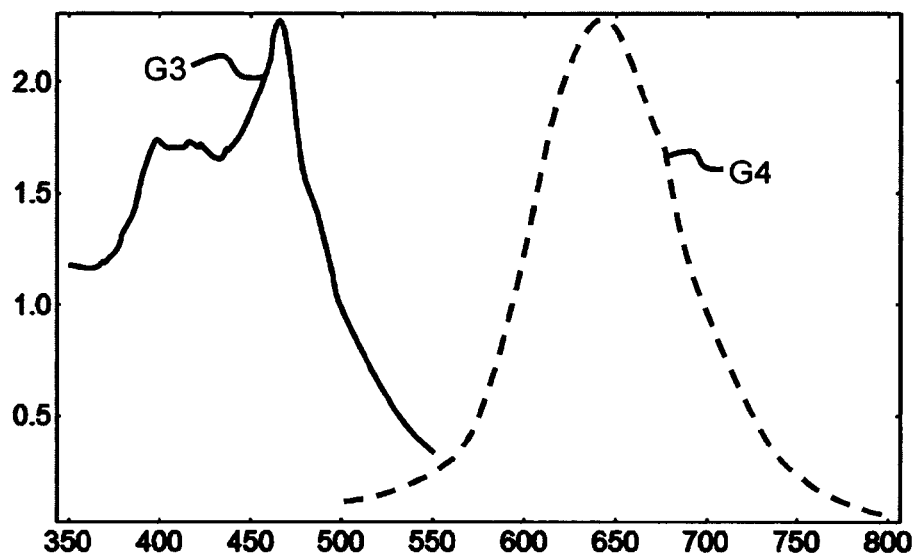
FIG. 3 shows a graphic representation of excitation and emission spectra of an embodiment of a phosphor arrangement with red phosphor according to the present patent application.

FIG. 3 shows a graphic representation of excitation spectrum G3 and emission spectrum G4 of an embodiment of the phosphor arrangement 30 with red phosphor 24. The X-axis represents the wavelength in nanometer and Y-axis represents corresponding counts/$10^6$.

The emission spectrum G3 was measured after excitation at 466 nanometer and the excitation spectrum G4 was measured at 642 nanometer. The red phosphor 24 exhibited the FWHM around 100 nanometer which is between 600-700 nanometer in terms of the wavelength range. The red phosphor 24 exhibited a Stoke's shift of 176 nanometer.

Figure 4:
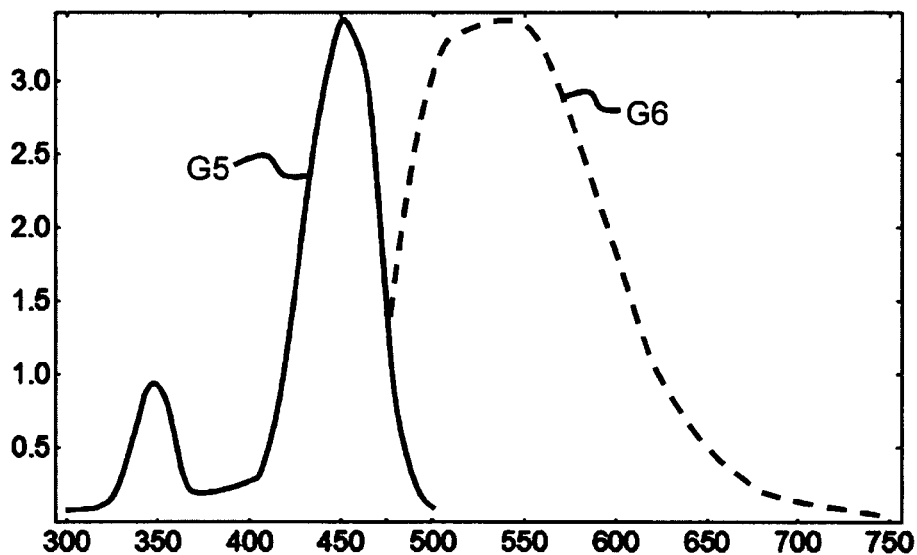
FIG. 4 shows a graphic representation of excitation and emission spectra of an embodiment of a phosphor arrangement with green phosphor according to the present patent application.

FIG. 4 shows a graphic representation of excitation spectrum G5 and emission spectrum G6 of an embodiment of the phosphor arrangement 30 with green phosphor 23. The X-axis represents the wavelength in nanometer and Y-axis represents corresponding counts/$10^6$.

The emission spectrum G5 was measured after excitation at 452 nanometer and the excitation spectrum G6 was measured at 544 nanometer. The green phosphor 23 exhibited the FWHM around 150 nanometer which is between 470-620 nanometer in terms of the wavelength range. The green phosphor 23 exhibited a Stoke's shift of 92 nanometer.

Figure 5:
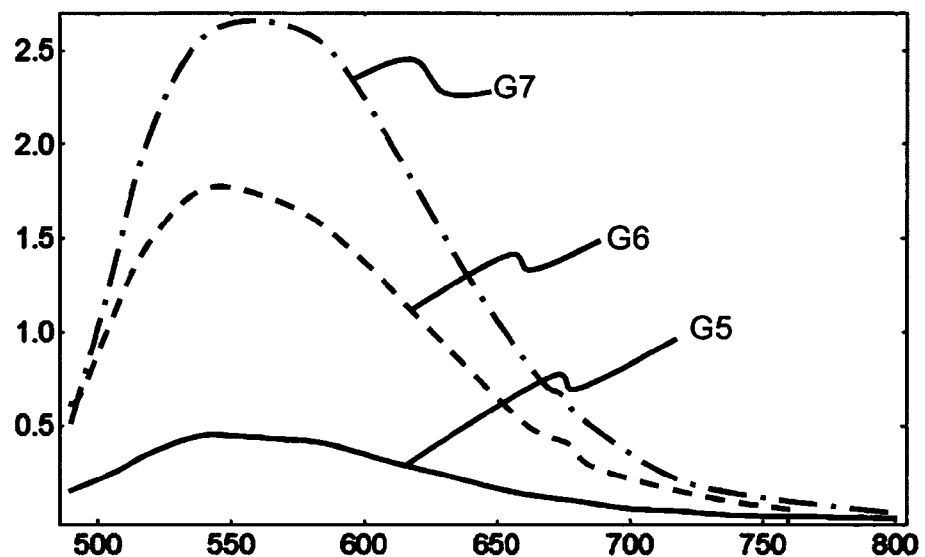
FIG. 5 shows a graphic representation of emission spectra of further embodiments of a phosphor arrangement with yellow phosphor in dependence with different content of metallic nanoparticles according to the present patent application.

FIG. 5 shows a graphic representation of emission spectra G5, G6, G7 of further embodiments of the phosphor arrangement 30 with the yellow phosphor 22 in dependence with different content of the metallic nanoparticles 5. The X-axis represents the wavelength in nanometer and Y-axis represents corresponding counts/$10^6$.

FIG. 5 reveals different emission spectra G5, G6, G7 in dependence with different content of the metallic nanoparticles 5. Namely no metallic nanoparticles 5 content (see emission spectrum G5), a content of the metallic nanoparticles 5 of 1.5 mmol/kg of the polymer 20 (see emission spectrum G7) and a content of the metallic nanoparticles 5 of 3.0 mmol/kg of the polymer 20 (see emission spectrum G6). Here the presence of the metallic nanoparticles 5 within the polymer 20 enhances the emission intensity of the yellow phosphor 22 approximately 6.75 times with respect to yellow phosphor 22 without the metallic nanoparticles 5. FIG. 5 shows that an optimum ratio of metallic nanoparticles 5 to the total weight of the polymer 20 is preferably given by the content of the metallic nanoparticles 5 of 1.5 mmol/kg of the polymer 20.

Figure 6:
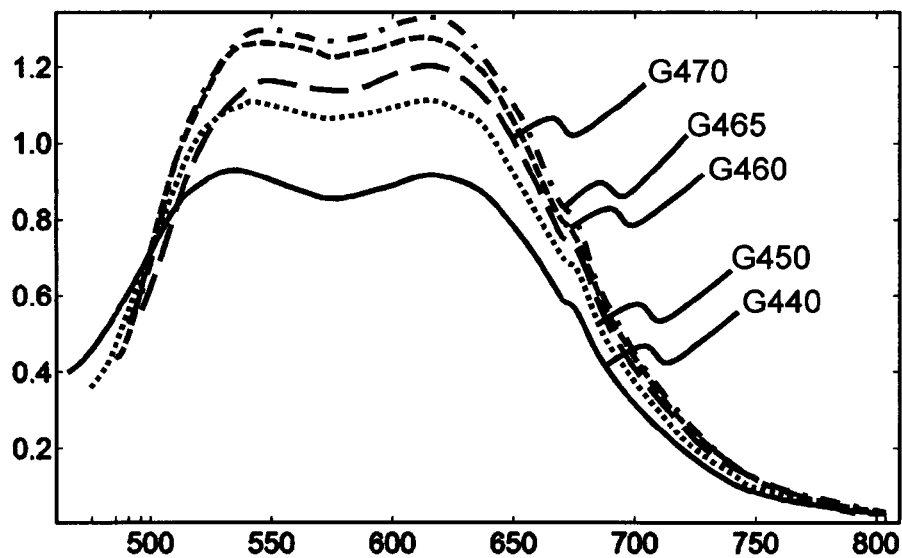
FIG. 6 shows a graphic representation of emission spectra of an embodiment of a phosphor arrangement with yellow and red phosphors detected at different excitation wavelengths according to the present patent application.

FIG. 6 shows a graphic representation of emission spectra of an embodiment of the phosphor arrangement 30 with yellow phosphor 22 and red phosphor 24 detected at different excitation wavelengths. The X-axis represents the wavelength in nanometer and Y-axis represents corresponding counts/10$^6$.

The emission spectra G440, G450, G460, G465 and G470 have been measured on basis of a phosphor mixture 21 comprising the yellow phosphor 22 and the red phosphor 24 in conjunction with or rather doped with the metallic nanoparticles 5 upon excitation at 440, 450, 460, 465 and 470 nanometer. The effective bandwidth of the commercially available GaN-based blue LEDs lies typically between the wavelength range of 450-465 nm. As can be seen of FIG. 6 warm white light W1 with an effective bandwidth substantially between 520 nanometer and 650 nanometer can be achieved.

Figure 7:
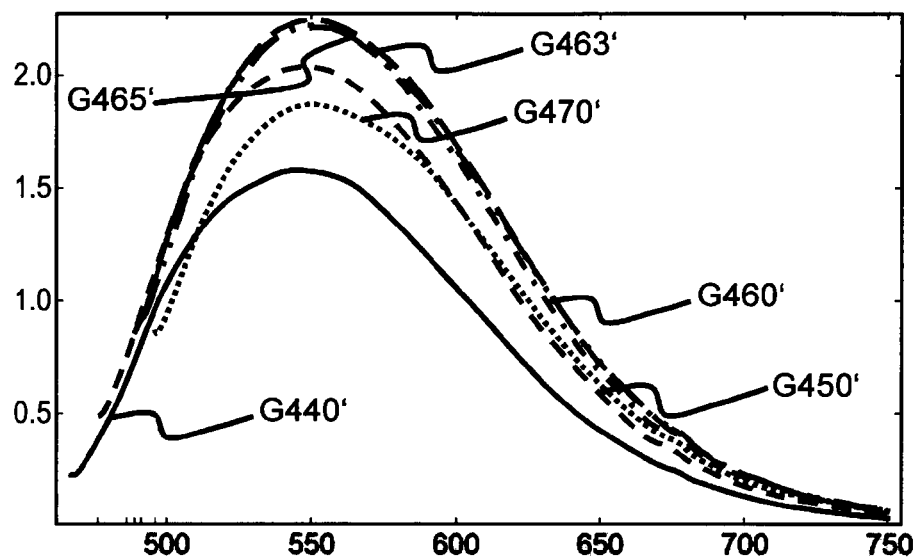
FIG. 7 shows a graphic representation of emission spectra of an embodiment of a phosphor arrangement with yellow and green phosphors detected at different excitation wavelengths according to the present patent application.

FIG. 7 shows a graphic representation of emission spectra of an embodiment of the phosphor arrangement 30 with yellow phosphor 22 and the green phosphor 23 detected at different excitation wavelengths. The X-axis represents the wavelength in nanometer and Y-axis represents corresponding counts/10$^6$.

The emission spectra G440', G450', G460', G463', G465' and G470' have been measured on basis of a phosphor mixture 21 comprising the yellow phosphor 22 and the green phosphor 23 in conjunction with or rather doped with the metallic nanoparticles 5 upon excitation at 440, 450, 460, 463, 465 and 470 nanometer. As can be seen of FIG. 7A the emission spectra G440', G450', G460', G463', G465' and G470' cover the range of commercially available blue LEDs.

Figure 8:
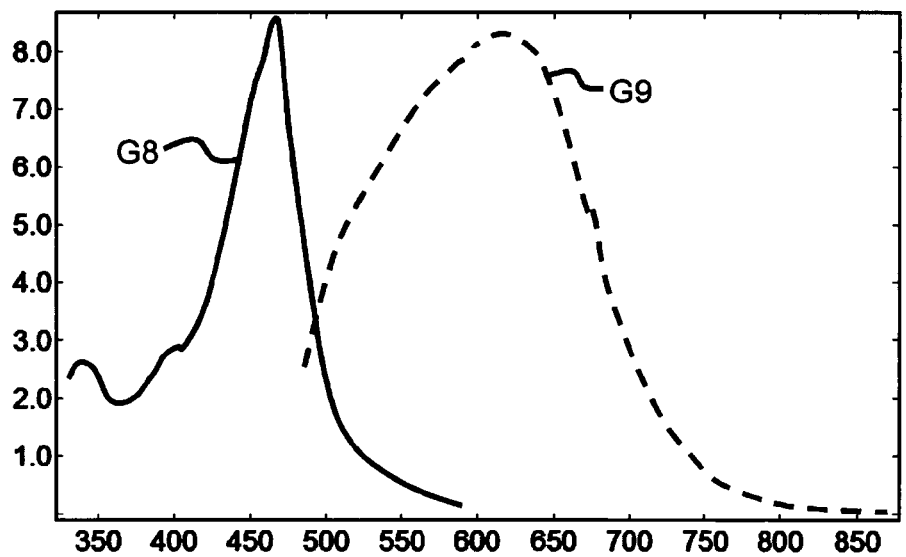
FIG. 8 shows a graphic representation of excitation and emission spectra of an embodiment of a phosphor arrangement with yellow, green and red phosphors in conjunction with the metallic nanoparticles measured after excitation with a wavelength of 465 nanometer according to the present patent application.

FIG. 8 shows a graphic representation of excitation spectrum G8 and emission spectrum G9 of an embodiment of the phosphor arrangement 30 with the yellow phosphor 22, the green phosphor 23 and the red phosphor 24 in conjunction with the metallic nanoparticles 5 measured after excitation with a wavelength of 465 nanometer. The X-axis represents the wavelength in nanometer and Y-axis represents corresponding counts/10$^6$.

The phosphor arrangement 30 exhibits excitation and emission maxima of 466 nanometer and 618 nanometer, respectively. The metallic nanoparticle 5 doped polymer with the yellow phosphor 22, the green phosphor 23 and the red phosphor 24 exhibited a broad FWHM around 200 nanometer which is between 500 nanometer and 700 nanometer in terms of the wavelength range. Thus, the phosphor arrangement exhibited a Stoke's shift of 152 nm. By the here described phosphor arrangement 30 a Correlated Color Temperature (CCT) range between 3000-4000 K can be also efficiently obtained.

Figure 9:
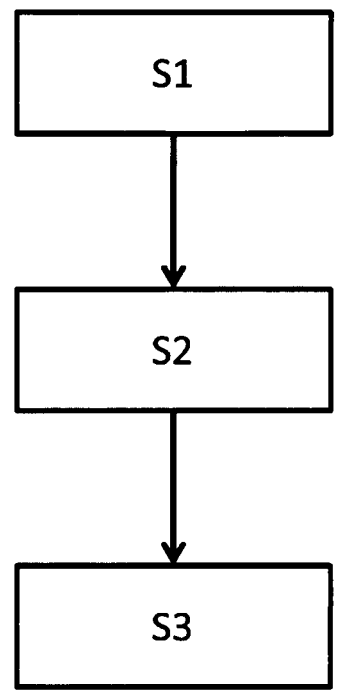
FIG. 9 shows a flow diagram of an embodiment of a method according to the present patent application.

FIG. 9 shows a flow diagram of an embodiment of a method for manufacturing the phosphor arrangement 30.

The method starts with a first step S1 arranging a polymer 20 with a phosphor mixture 21 on a mounting surface 11 of a substrate 10. A second step S2 comprises adding metallic nanoparticles 5 in the phosphor mixture 21, wherein a content of the metallic nanoparticles 5 is between 1,5 to 3.0 mmol/kg of the polymer 20. The method ends with the step S3 encapsulating the mounting surface 11 of the substrate 10 by cross-linking of the polymer 20 with the phosphor mixture 21 and the metallic nanoparticles 5.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The present invention provides a phosphor arrangement 30 for light conversion, in particular for conversion of blue light into white light. The phosphor arrangement 30 comprises a substrate 10 with a mounting surface 11. The phosphor arrangement 30 further comprises a polymer 20 with a phosphor mixture 21, wherein the polymer 20 is arranged on the mounting surface 11, and wherein the phosphor mixture 21 comprises metallic nanoparticles 5, and wherein a content of the metallic nanoparticles 5 is between 1.5 to 3.0 mmol/kg of the polymer 20. The present invention further provides a corresponding method.

LIST OF REFERENCE SIGNS 5 metallic nanoparticles
10 substrate
11 mounting surface
12 opposite site
20 polymer
21 phosphor mixture
22 yellow phosphor
23 green phosphor
24 red phosphor
30 phosphor arrangement
G1-G9 graphs
G440, G450, G460, G465, G470 graphs upon different excitation
G440', G450', G460', G463', G465', G470' graphs upon different excitation
B1 blue light
W1 warm white light
S1-S3 method steps

The invention claimed is:

1. Phosphor arrangement for light conversion, in particular for conversion of blue light into white light, comprising:
    a substrate with a mounting surface,
    a polymer with a phosphor mixture, wherein the polymer is arranged on the mounting surface, and wherein
    the phosphor mixture comprises metallic nanoparticles, and
    wherein a content of the metallic nanoparticles is between 1.5 to 3.0 mmol/kg of the polymer.

2. Phosphor arrangement according to claim 1, wherein the phosphor mixture comprises yellow phosphor, green phosphor and red phosphor.

3. Phosphor arrangement according to claim 2, wherein yellow phosphor, green phosphor and red phosphor are configured to be mixed in a ratio of 1:3:1 by weight.

4. Phosphor arrangement according to claim 2, wherein yellow phosphor, green phosphor and red phosphor are configured to be mixed in a ratio of 1:5:1 by weight.

5. Phosphor arrangement according to claim 1, wherein the metallic nanoparticles comprise silver nanoparticles, gold nanoparticles, silver coated zinc oxide nanohexagons or gold coated zinc oxide nanohexagons.

6. Phosphor arrangement according to claim 5, wherein a diameter of the metallic nanoparticles is preferably in a range of 20 nanometers and 100 nanometers.

7. Phosphor arrangement according to claim 1, wherein the polymer comprises a two component polymer or a two component silicone.

8. Phosphor arrangement according to claim 7, wherein the polymer comprises a two component silicone, and wherein the two component silicone comprises phenyl silicone with a refractive index between 1.52 and 1.56.

9. Phosphor arrangement according to claim 1, wherein the substrate comprises polystyrene, poly(methyl methacrylate) or polycarbonate.

10. Phosphor arrangement according to claim 1, wherein a thickness of the polymer is between 15 to 20 micrometers.

11. Method for manufacturing a phosphor arrangement, the method comprising the steps of:
  arranging a polymer with a phosphor mixture on a mounting surface of a substrate,
  adding metallic nanoparticles in the phosphor mixture, wherein a content of the metallic nanoparticles is between 1.5 to 3.0 mmol/kg of the polymer, and
  encapsulating the mounting surface of the substrate by cross-linking of the polymer with the phosphor mixture and the metallic nanoparticles.

12. Phosphor arrangement according to claim 11, wherein the metallic nanoparticles are homogeneously distributed within the phosphor mixture.

13. Phosphor arrangement according to claim 11, wherein yellow phosphor, green phosphor and red phosphor are homogeneously distributed within the phosphor mixture.

* * * * *